United States Patent [19]

Temple et al.

[11] Patent Number: 4,905,075
[45] Date of Patent: Feb. 27, 1990

[54] HERMETIC SEMICONDUCTOR ENCLOSURE

[75] Inventors: Victor A. K. Temple, Clifton Park; Alexander J. Yerman, Scotia, both of N.Y.

[73] Assignee: General Electric Company, Schenectady, N.Y.

[21] Appl. No.: 287,767

[22] Filed: Dec. 21, 1988

Related U.S. Application Data

[63] Continuation of Ser. No. 859,598, May 5, 1986, abandoned.

[51] Int. Cl.⁴ .................... H01L 23/02; H01J 15/00
[52] U.S. Cl. .......................... 357/74; 357/72; 357/73; 357/75; 174/50.5; 174/50.51; 174/50.52; 361/331; 361/380; 361/381
[58] Field of Search ............... 357/74, 74 C, 75, 80, 357/72, 73; 174/50.5, 50.51, 50.52, 50.54, 50.61, 52; 361/331, 380, 381

[56] References Cited

U.S. PATENT DOCUMENTS

| | | | |
|---|---|---|---|
| 3,588,632 | 6/1971 | Nakata | 317/234 |
| 3,688,018 | 8/1972 | Hiscocks | 174/68.5 |
| 3,908,187 | 9/1975 | Sheldon et al. | 357/81 |
| 3,909,332 | 10/1975 | Yerman | 156/309 |
| 3,925,808 | 12/1975 | Rai-Choudhury | 357/67 |
| 3,975,758 | 8/1976 | Schlegel | 357/74 |
| 4,024,569 | 5/1977 | Hawrylo et al. | 357/71 |
| 4,032,960 | 6/1977 | Anthony et al. | 357/51 |
| 4,092,614 | 5/1978 | Sakuma et al. | 331/94.5 |
| 4,109,273 | 8/1978 | Glasl et al. | 357/35 |
| 4,129,243 | 12/1978 | Cusano et al. | 228/122 |
| 4,170,490 | 10/1979 | Anthony et al. | 148/1.5 |
| 4,280,854 | 7/1981 | Shibata et al. | 148/1.5 |
| 4,427,993 | 1/1984 | Fichot et al. | 357/81 |
| 4,430,793 | 2/1984 | Hart | 29/578 |
| 4,476,483 | 10/1984 | van de Ven et al. | 357/71 |
| 4,628,147 | 12/1986 | Bennett | 174/50.61 |
| 4,677,454 | 6/1987 | Kryohara | 357/74 |
| 4,745,455 | 5/1988 | Glascock, II et al. | 357/74 |

FOREIGN PATENT DOCUMENTS

| | | |
|---|---|---|
| 0079265 | 5/1983 | European Pat. Off. . |
| 0167078 | 8/1986 | European Pat. Off. . |
| 0007680 | 1/1977 | Japan ............ 357/74 |
| 54-58359 | 5/1979 | Japan . |
| 0128275 | 10/1979 | Japan ............ 357/80 |
| 57166052 | 1/1983 | Japan . |
| 0098451 | 6/1984 | Japan ............ 357/75 |
| 60-157255 | 12/1985 | Japan . |
| WO82/02800 | 8/1982 | PCT Int'l Appl. . |
| WO85/05733 | 12/1985 | PCT Int'l Appl. . |

OTHER PUBLICATIONS

Anthony, T. R., "Forming Electrical Interconnections through Semiconductor Wafers", Journal of Applied Physics, 52(8), Aug. 1981, pp. 5340-5349.
Anthony, T. R., "Diodes Formed by Laser Drilling and Diffusion", Journal of Applied Physics, 53(12), Dec. 1982, pp. 9154-9164.

Primary Examiner—William L. Sikes
Assistant Examiner—Georgia Y. Epps
Attorney, Agent, or Firm—Robert Ochis; James C. Davis, Jr.; Marvin Snyder

[57] ABSTRACT

A semiconductor hermetic package for semiconductor device comprises base, sidewall and cover members. Signals can be coupled between the enclosed devices and external devices by coupling means including conductive regions disposed in and through the package. Light pipes or conductive tracks and paths extending through the package can be used to couple the signals. A portion of the package can function as a grading resistance.

24 Claims, 4 Drawing Sheets

HERMETIC SEMICONDUCTOR ENCLOSURE

This application is a continuation of application Ser. No. 859,598 filed May 5, 1986 and abandoned.

The present invention relates generally to packages for devices fabricated in semiconductor chips and in particular, to inexpensive heat dissipative packages fabricated of semiconductor material for hermetically enclosing one or more chip based devices. The package in a preferred embodiment exhibits a thermal expansion coefficient which closely matches the thermal expansion coefficient of the enclosed device. External connections can be made to the enclosed device by establishing conductive contact regions in and through the semiconductor package material or alternatively by establishing appropriate hermetic couplings or connections through the semiconductor material. The conductive regions can be patterned to match the pattern of the device electrode to maximize the contact area between the device terminal and contact region.

BACKGROUND OF THE INVENTION

Heretofore, semiconductor devices have been fabricated in semiconductor substrates and enclosed or potted within sealed plastic packages. A plastic package, for instance, was filled with a silicone or plastic material to enclose a chip and provide a quasi-impermeable chip package. Chips, in some instances, were mounted on an additional substrate for ease in handling and to add mechanical strength to the chip to better enable the chip to resist impact or other mechanical stresses. Such substrates included ceramics, glass, and low expansion alloys. In general, the chip was bonded to the substrate and a plurality of wire bond contacts were made between the chip and contact pads disposed on the substrate around the periphery of the chip. External connections to the chip were made by connecting to the contact pad disposed on the substrate.

The above-discussed packages, however, exhibited a number of drawbacks. Chips including high power devices, had significant thermal dissipation problems. When the substrate material was different from the chip material, thermal stress developed between the chip and the substrate and, in some instances, produced cracking or other deformation of the chip to adversely effect the performance of the fabricated device or contribute to device failure. In conventional packages, heat generated by a chip was dissipated from only a portion of a single chip surface because only one face of the chip was in contact with a thermally conductive heat sink. Insufficient thermal dissipation from heat generating chips has caused inefficient operation of some semiconductor devices and contributed to the establishment of leakage currents and/or thermal breakdowns in those devices. Moreover, high temperature conditions within potted chip packages often led to deterioration and cracking of the potting material, contributing to air or moisture leaks in the package.

In packages exhibiting particularly poor thermal dissipation, the thermal buildup at times has been sufficient to melt the solder connections typically employed between the chip and the substrate. Moreover, packages used in radiation environments and employing internal wire bonds with, for instance, gold wires or other wires having high atomic numbers, were particularly susceptible to the absorption of x-rays, leading to a potential vaporization of the wire and failure of the device.

BRIEF SUMMARY OF THE INVENTION

It is an object of the present invention to provide an improved hermetically sealed semiconductor enclosure which is better able to withstand mechanical shock.

It is another object of the present invention to provide a hermetic semiconductor enclosure which can eliminate the wire bonds heretofore required for interconnecting the device electrodes and the package terminal.

It is a still further object of the present invention to provide an all semiconductor hermetic package which employs semiconductor materials exhibiting a coefficient of thermal expansion approximately equal to the coefficient of expansion of the enclosed chip to minimize or avoid establishing thermal stresses within the hermetic package.

It is yet another object of the present invention to provide a hermetic semiconductor package for semiconductor chips and power devices having improved thermal dissipation properties.

It is yet another object of the present invention to provide a hermetic semiconductor package which efficiently dissipates heat from two or more surfaces.

It is an additional object of the present invention to provide a hermetic semiconductor package with external electrical contacts which can also be used to dissipate heat.

It is a further object of the present invention to provide a semiconductor package in which a portion of the package can be used as a grading resistance.

The present invention provides an enclosure, fabricated almost entirely of semiconductor materials, for hermetically enclosing a chip based semiconductor device. In a preferred embodiment, the package can comprise a high conductivity semiconductor base, a high resistivity polysilicon or oxygen-doped polysilicon sidewall spacer disposed on and sealingly engaging the base and a semiconductor cover also sealingly engaging the sidewall spacer. The sidewall spacer and the base member in combination define a chip-receiving cavity in the central portion thereof One or more conductive contact washers can be placed on the upper surface of the enclosed chip based devices to interface and connect the terminals of the device to the appropriate portion of the semiconductor cover.

Connections to, for instance, the anode, cathode or gate electrodes of a particular chip based device can be made by a number of techniques. An appropriate electrode of the device can be conductively connected to a portion of the semiconductor enclosure by, for instance, a highly conductive contact washer. In one embodiment, a particular portion of the semiconductor enclosure or a member thereof can be highly doped to establish a conductive region or zone through the exterior wall of that particular portion of the enclosure in registry with the highly conductive contact washer, which in turn is conductively connected directly to the desired electrode of the enclosed chip based device. In an alternative embodiment, an opening can be made through a portion of the enclosure which is in registry with a highly conductive contact washer or an electrode of the enclosed device. The opening can, for instance, be made by laser drilling. The opening can then be refilled and sealed with a conductive material to provide a hermetic conductive via through the enclosure. In a still further alternate embodiment involving a light responsive device, a hole can be opened through a portion of the enclosure, to allow a light signal to impinge upon a selected light reactive terminal of the enclosed light responsive device. In an alternate preferred embodiment, the enclosed device can be responsive to other electromagnetic signals such as microwave signals and the enclosure can include means for coupling those electromagnetic signals through the semiconductor enclosure to the enclosed device.

In a further embodiment, the exterior surfaces of the base and cover members of the semiconductor package can be coated with a layer of heat conductive interface material such as structured copper to facilitate bonding of the package to an external heat dissipative medium such as, for instance, a fluid cooled metal heat sink to further dissipate heat generated by the device enclosed within the package and to thereby avoid or reduce the thermal stress between the device and the package.

In a still further preferred embodiment, the semiconductor package can be at least partially enclosed within a rubber mounting or housing to provide additional shock absorbing protection.

In yet another alternate preferred embodiment, the chip containing semiconductor device can be used as the base member of the enclosure and the side walls can be built up, for instance, by depositing and configuring a glass or oxide layer on the chip face. A semiconductor cover member can be applied to the built-up side walls to enclose an otherwise exposed portion of the device. As before, connections to the device electrodes can be made by establishing high conductivity regions in and through the semiconductor enclosure. The regions can be aligned with or be in registry and electrical contact with the appropriate device electrodes, or alternatively, hermetic conductive via connections can be made through one or more portions of the enclosure to electrically connect with the appropriate electrode of the device.

Portions of the enclosure in registry with the electrode can, in an alternate preferred embodiment, include a layer of conductive material such as a metal disposed on one or more members of the package to provide intra device and inter device connections both internal and external to the package. In one embodiment, the metal can be deposited by evaporation or chemical deposition and etched to the desired pattern.

The hermetic semiconductor package of the present invention provides an enclosure for chip base devices having a capacity to readily absorb heat at a rate which is approximately equal to or greater than the rate at which heat is generated by the device to facilitate and improve heat dissipation from the chip based device to the package and from the package to the external environment. The improved semiconductor package also reduces or eliminates the need for wire bonds and contact fingers to extend from the device electrode through package enclosure to the selected external contact, to reduce the number of sites where hermeticity of the package can be impaired. In addition, the gold wire bond contacts heretofore used can be eliminated to alleviate a possible failure points. Further, the device package protects the enclosed chip and its associated connections from exposure to ambient radiation and thus obviates another potential source of potential failure.

BRIEF DESCRIPTION OF THE DRAWINGS

The features of the present invention which are believed to be novel are specified with particularity in the appended claims. The invention itself, however, both as to organization and method of operation, together with further objects and advantages thereof may be best understood by reference to the following detailed description when taken in conjunction with the accompanying drawings in which:

DETAILED DESCRIPTION OF THE PREFERRED EMBODIMENTS

The present invention is applicable to a broad range of semiconductor devices fabricated from a variety of different semiconductor materials. Silicon devices or devices fabricated in silicon chips make up an overwhelming majority of the currently available semiconductor devices and consequently, the most commonly encountered applications of the present invention will involve silicon substrate devices. Moreover, while the present description discusses a number of preferred embodiments directed to silicon substrate semiconductor devices, it is intended that these disclosures be considered as illustrative examples of the preferred embodiments of the present invention and not as a limitation on the applicability of the present invention. Further, while particularly preferred results can be achieved when, for instance, both the device and package are fabricated from the same semiconductor material, the present invention is intended to encompass packages and devices fabricated semiconductor materials even though the semiconductor material of the device is different from the semiconductor material of the package. It is, however, important that the thermal expansion coefficient of the package closely approximate or match the thermal expansion coefficient of the chip based device to avoid thermally induced stress between the package and the device.

Figure 1:
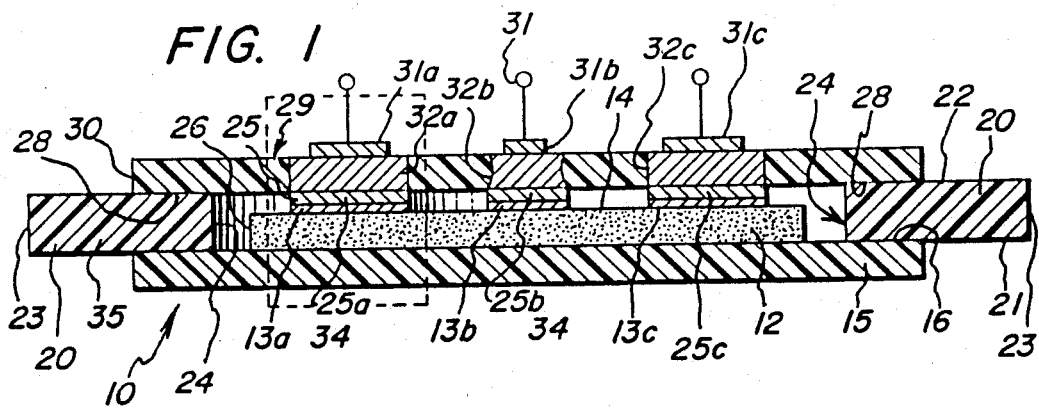
FIG. 1 is a cross-sectional view of a semiconductor package in accordance with the present invention.

In FIGS. 1, 1a, 2, 3, 4, 5, 6, 7, 8 and 9, corresponding parts have been designated with the same reference numeral as an aid to understanding the description of the present invention. As illustrated in FIG. 1, a semiconductor package 10 in accordance with the present invention, can hermetically enclose therein a semiconductor chip mounted device 12. For the purpose of illustration, the device 12 is chosen to be a silicon device having laterally spaced first, second and third metallized electrodes 13a, 13b, and 13c, respectively disposed on the upper surface 14 of the chip based device. While the component parts of the all-semiconductor package 10 are discussed in detail below, in a preferred embodiment the parts can comprise semiconductor materials which are essentially the same as the material of the device to, for instance, improve heat transfer from the device to the package and minimize thermal stress which might otherwise occur between a device 12 and package 10 made from different materials. In the example under consideration, the package 10 and the chip 12 are fabricated from a silicon semiconductor.

The semiconductor package 10 of the present invention comprises a base member 15, a sidewall member 20, and a cover member 30. The base member 15 is substantially planar and has a circular or disk shaped configuration. The base 15 is typically a silicon wafer having a thickness of in the range of 5-30 mils. In a preferred embodiment, the base 15 can be fabricated from a polysilicon wafer having, for example, high resistivity of approximately $10^6$ ohm-cm also referred to as High R Polysilicon (HRPS). In an alternate preferred embodiment, the base 15 can be fabricated from oxygen doped polysilicon (ODPS) having a resistivity of, for example, approximately $10^8$ ohm-cm.

A central portion of the base 15 is adapted to receive a semiconductor device 12 in chip form. Peripheral portions of the base 15, not underlying the semiconductor device chip 12, provide an exposed surface 16 which can receive and sealingly engage the sidewall member 20 of the package 10. The package sidewalls can, for instance, be fabricated from a circular/cylindrical sidewall washer or spacer 20 made of a semiconductor material which advantageously can have a high resistivity, such as HRPS or ODPS. The cross-sectional view of the packaging system 10 of the present invention illustrated in FIG. 1 shows a portion of the sidewall washer 20 disposed on both the left and right sides of the all-semiconductor package 10. This illustration should therefore be understood to disclose a sidewall member 20 exhibiting an annular configuration of substantially planar lower and upper surfaces 21 and 22, respectively, and substantially cylindrical exterior and interior walls 23 and 24, respectively. In a preferred embodiment the lower surface 21 of the sidewall 20 contacts and engages the upper peripheral surface 16 of the base 15 in a hermetic seal. The upper surface 22 of the sidewall 20 contacts and engages a lower surface 28 of the cover 30 also in a hermetic seal. The cover 30, sidewall 20 and base 15 can be hermetically sealed to each other by, for instance, eutectic bonding, thermal compression bonding, solder bonding or other techniques hereinafter described. Alternately, when metallized surfaces are provided, E beam welding can be used to hermetically seal the package 10.

The outer surface 23 of the semiconductor sidewall washer 20 defines the lateral extent of the package while the inner surface 24 of this sidewall washer 20, taken in combination with the base 15, defines a recessed cavity for receiving the semiconductor device 12. In a preferred embodiment, the sidewall washer 20 has a thickness measured by the height of the sidewall which is greater than the thickness of the semiconductor device chip 12. Typical thicknesses of the sidewall washer 20 may be in the range of 15-40 mils. In an alternate preferred embodiment, the thickness of the sidewall washer should be approximately equal to the combined thickness of the semiconductor device chip 12 and the contact washer 25, discussed below.

The semiconductor device 12 is typically fabricated from a substantially planar semiconductor substrate. In the illustrated example, the metallized electrodes 13a–13c are disposed on the upper surface 14 of the chip 12 and the electrodes 13a–13c are thus disposed in a plane which is substantially parallel to the plane of the base 15.

The cover member 30 can also be fabricated from semiconductor materials, such as a silicon wafer and more particularly, the HRPS or ODPS wafer discussed above. The cover member 30 has substantially parallel lower and upper surface 28 and 29, respectively, and is substantially planar. In the illustrated embodiment the cover is circular or disk shaped and has a thickness which may be in the range of 5-15 mils. A peripheral portion of the lower surface 28 of the cover member 30 is designed to contact and engage the upper surface 22 of the sidewall washer 20 to hermetically seal and enclose the semiconductor device 12 within the all-semiconductor package 10.

In a preferred embodiment, package 10 includes a means to couple a signal between an external device (not shown) and the enclosed device 12. In the illustrated embodiment, the cover member 30 includes one or more external terminals 31. The cover 30 also includes a means to couple a signal between the external terminal 31 to an electrode 13 of the internal device 12 and vice versa. In the example illustrated in FIG. 1, metallized terminals 13a, 13b, and 13c, respectively, can be, for instance, the anode, cathode and gate electrodes of the device. The cover member 30 is similarly provided with first, second, and third external terminals 31a, 31b, and 31c, respectively, which are intended for connection to the corresponding device terminals 13a, 13b, and 13c. The means for interconnecting the external cover terminals 31a, 31b, and 31c to the device terminals 13a, 13b, and 13c, respectively, in this example includes three corresponding highly conductive regions 32a, 32b, and 32c established in and through portions of the semiconductor cover 30 in registry with, and in this example overlying, the corresponding terminals 13a, 13b, and 13c, respectively, of the semiconductor device 12. The highly conductive regions 32 can be established by a number of methods which are advantageously performed prior to final assembly of the cover 30, sidewall 20 and base 15 to form the semiconductor package 10. Specifically, the conductivity of a selected region or regions of the package 10, for instance, is altered not only on the surface of the cover wafer 30, but also throughout the entire cross section of the region of zone 32 of the cover 30 to render the selected cover region conductive from the lower cover surface 28 to the upper cover surface 29.

A first preferred method of establishing the conductive region 32a in the semiconductor cover 30 can include the steps of coating the cover 30 with an insulating oxide layer, defining a region of the cover 30 to be rendered conductive corresponding, for instance, to a selected one of electrodes 13a–13c of the semiconductor device 12, opening a window through the oxide layer overlying the region to be rendered conductive, and increasing the conductivity of the selected region.

As known to those skilled in the art, the conductivity of a region can be increased by increasing the doping concentration of the region. In one embodiment, the impurity concentration of the region can be increased to a concentration in excess of $10^{22}$ dopant atoms per cc. The impurity concentration of a semiconductor can be increased by diffusion of impurities into the semiconductor as taught, for instance, by Grove in *Physics and Technology of Semiconductor Devices*, John Wiley and Sons, 1967, pages 35–78. Alternatively, the conductivity and impurity concentration of the selected region 32 of the cover 30 can also be altered by other well known processes such as ion implantation followed by diffusion, as disclosed by Sze, *Physics of Semiconductor Devices* 2nd Edition, pages 64–66, John Wiley and Sons, 1981.

In a still further preferred embodiment, the conductivity of a selected region 32 of the cover 30 can be altered by, for instance, establishing a conductive via therethrough. A hole can be drilled through the cover member 30 by, for instance, a laser and then the hole can be refilled with a conductive material such as copper. Suitable techniques are described in the articles by TR Anthony entitled "Dodes Formed by Laser Drilling and Diffusion", *Journal of Applied Physics*, Vol. 53, December 1982, pages 9154–9164 and "Forming Electrical Interconnections Through Semiconductor Wafers", *Journal of Applied Physics*, Vol. 52, August 1981, pages 5340–5349. A still further technique is disclosed in U.S. Pat. No. 4,170,490 to Anthony et al., Process for Thermal Gradient Zone Melting Utilizing a Beveled Wafer Edge and other patents cited therein, the entirety of each of these being incorporated herein by reference.

Figure 1A:
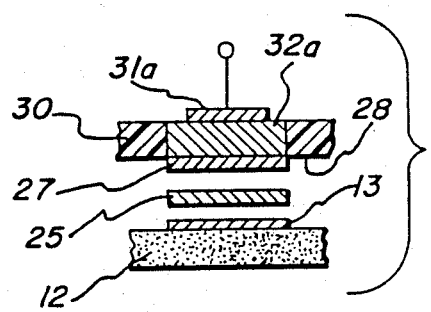
FIG. 1a is a magnified and exploded view of a portion of FIG. 1 enclosed with the dashed lines.

Referring now to FIG. 1a, a magnified and exploded view of the portion of FIG. 1 enclosed within the dashed lines is shown. The internal surface 28 of the conductive region 32 can be coated with an electrically conductive material 27 such as a metal, for instance copper, to facilitate a low resistance electrical connection between the conductive regions 32a, 32b, and 32c of the cover 30 and the respective electrodes 13a, 13b, and 13c of the semiconductor device 12. The conductive material 27 can, for instance, include reflowable solder to facilitate the establishment of a solder bond connection between the conductive region 32 of the cover 30 and corresponding terminal 13 of the device 12. The reflowable solder can be heated and subsequently cooled to form a solder bond and electrical and mechanical connection between, for instance, the device electrode 13 and the corresponding region 32 of the cover 30. Further, the conductive material 27 can be deposited as a metallized track or path deposited on the lower or inner surface 28 of the cover 30 or upper surface 16 of the base 15 to provide intra chip and inter chip connections.

The cover 30 is applied to the upper surface 22 of the sidewall washer 20 to enclose and hermetically seal a semiconductor device 12 previously mounted on the base 15 within the enclosure 10. The conductive regions 32a, 32b, and 32c of the cover 30 make physical and electrical contact with the device electrodes 13a, 13b, and 13c to allow external electrical connections to be made to the enclosed device 12 through the cover 30. In a first preferred embodiment not illustrated in FIG. 1, the conductive regions 32a–32c can be directly connected by pressure type contact to their respective device electrodes 13a–13c. A direct connection of this type mandates very close tolerances in the dimension of the respective package members to allow the conductive regions 32a, 32b, and 32c of the cover 30 to contact their respective device electrodes 13a, 13b, and 13c with pressure within a zone of preferred pressures to form the required low resistance electrical connection. Too much tolerance in the sizing of the package members can provide insufficient contact pressure causing, for instance, an undesirable high resistance contact. Alternatively, too much pressure can result in cracking or warping of the package 10 and enclosed chip 12. In either instance, the packaged device may fail to meet specifications.

Small dimensional mismatches can be overcome or adjusted for by including a contact washer 25 within the package and sizing the contact washers, in combination with the other package members to provide the proper pressure. Alternatively, these potential problems can be overcome by, for instance, the alternate preferred embodiment shown in FIG. 1 wherein contact washer 25 is a resilient compressible and highly conductive contact washer 25 and is used to conductively and resiliently interface the device terminal 13 to the corresponding conductive region 32 of the package 10. In the illustrated three electrode embodiment, three contact washers 25a, 25b and 25c are placed between the electrodes 13a, 13b, and 13c, respectively, of the semiconductor device 12 and the respective conductive regions 32a, 32b, and 32c of the cover 30. The contact washer 25, for instance, can be fabricated from structured copper to provide compressible resiliency and high conductivity. In the illustrated embodiment, the conductive regions 32a, 32b and 32c of the cover 30 overlie and are in registry with, or in spaced and aligned relation with, the respective device contacts 13, 13b and 13c. The above discussed conductive material 27, reflowable solder, can also be employed in this embodiment to mechanically and electrically connect the cover region 32 to the corresponding contact washer 25.

A further advantage resulting from the aforesaid assembly of base 15, sidewall washer 20 and cover 30 is that the sidewall washer can be employed as a grading resistor. As illustrated in FIG. 1, the sidewall washer 20 is shown to laterally project past the lateral edges of the cover 30 and base 15 members. These lateral projections of the sidewall can be trimmed by, for instance, a laser beam to provide the appropriate grading resistance for the device through the cover 30 and the base 15. This alternate construction has particular advantages when applied to thyristors and is useful to provide finished devices having closely matched operating characteristics. Conductive paths in or on the upper surface 16 of the base 15 and the lower surface 28 of the cover 30 can be used to connect an appropriate terminal 13 of the device 12 in parallel with the sidewall grading resistor 20 of the package 10.

In an alternate embodiment (not shown), only a single electrode 13, such as a cathode, is established on the upper surface of the device 12. Similarly, a single electrode such as an anode, can be established in the lower surface of the device 12. The cover and base members 15 and 30 respectively, can be fabricated from high conductivity semiconductor material and separated from each other by sidewall spacer 20 of appropriate resistivity. In particular, the resistivity of the sidewall spacer 20 can be selected to provide an appropriate grading resistance. In this instance, the sidewall can serve as a grading or matching resistor for a particular thyristor to allow a selected or controlled amount or portion of the current applied to the device to flow through the base 15, sidewall 20 and cover 30 between the anode and cathode electrodes to, for instance, enable thyristors to be matched and linked in parallel with each other.

Figure 3:
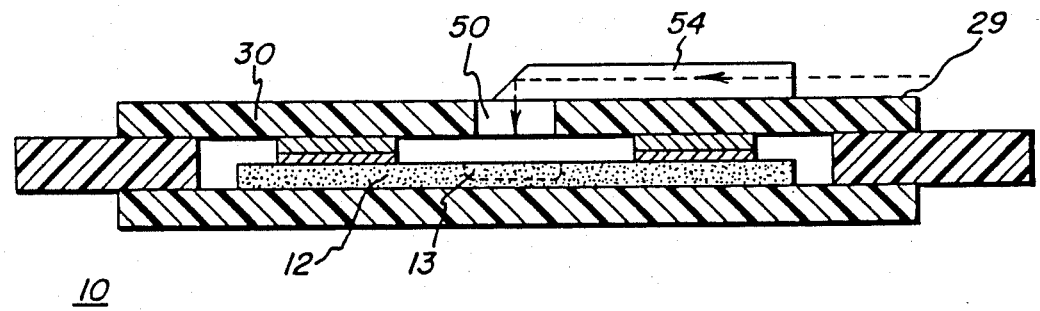
FIG. 3 is a cross-sectional view of an alternate preferred embodiment of the semiconductor package of the present invention enclosing a light responsive chip.

Further, as illustrated in FIGS. 1 and 3, the sidewall spacer 20 should provide a surface path length between the base 15 and the cover 30 and thus anode and cathode electrodes which is sufficiently long to avoid breakdown under normal atmospheric conditions.

Figure 2:
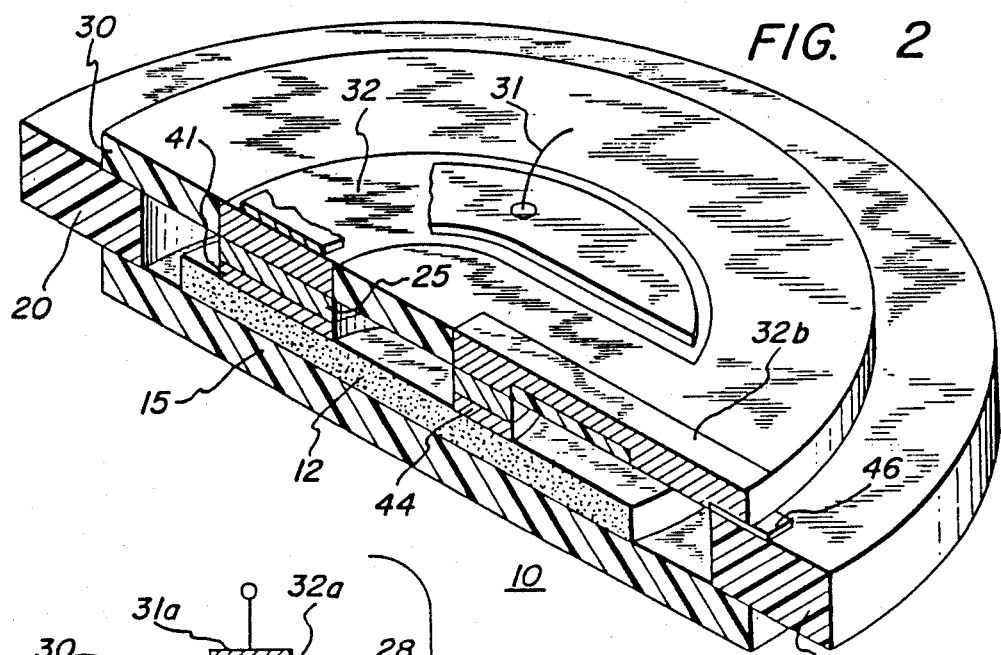
FIG. 2 is a three dimensional view, partially in cross-section, of an alternate preferred embodiment of a semiconductor package in accordance with the present invention.

A three dimensional view partially in cross-section of an all semiconductor hermetic package 10 in accordance with the present invention is shown in FIG. 2. The chip base device 12 is disposed on a base wafer 15 and surrounded by a sidewall spacer 20 and enclosed with a cover 30. A selected region 32 of the cover 30 may have a conductive pattern arranged in a shape to correspond to the shape of a portion of the device electrode. When the package is assembled, the region 32 engages and electrically connects to the contact washer 25 which in turn is in electrical contact with a corresponding terminal 13 provided on the upper surface of the device 12. In the illustrated example, the upper surface of the device 12 includes a cathode electrode 41 disposed thereon in a semi-circular or serpentine configuration. The central portion of the upper surface of the device 12 includes a gate region including a gate metallization layer 44 disposed thereon. Both device terminals 41 and 44 are interfaced to respective conductive regions 32a and 32b of the cover 30 by contact washers 25. As illustrated, the configuration of the cathode contact 41 has been substantially mirrored by the conductive region 32 established in the cover 30 but is interrupted near the gate region 32b to ensure maximum electrical contact between electrode 13 of the enclosed device 12 and the package terminal 31.

The gate electrode 44 also contacts a conductive region 32b of the cover 30, which in turn contacts a conductive track or path 46 disposed on the upper surface 22 of the sidewall 20. The metallized track 46 extends between the cover 30 and the sidewall 20 and can be used to provide contact to the sidewall grading resistance or alternatively serve as an external contact pad for the gate electrode.

In many instances, the device 12 can provide contact regions of sufficient dimension to accommodate placement or alignment errors of as much as 10-15 percent between the cover 30 and the device 12. However, in alternate embodiments, placement of the cover 30 and the conductive regions 32 thereof in precise corresponding relation with the device 12 and its electrodes is critical. In such instances, the cover 30 can be accurately positioned within one or two mils of the intended location.

In the alternate preferred embodiment of FIG. 3 the device 12 is disposed within a hermetic semiconductor package comprising a base wafer 15, a sidewall member 20 and a cover 30. At the outset of the discussion, it is best to understand precisely what is meant by the term hermetic in the context of FIGS. 3 and 4. In particular, even though there is an opening 50 through the cover 30 discussed below to, for instance, permit the insertion of a light pipe, the package 10 is said to hermetically seal the device 12 because the critical surface of the device 12, the surface of the high voltage blocking junction, is hermetically sealed. Thus, this high voltage junction is protected from contamination which might otherwise degrade the junction and the performance of the junction. Hermetic as applied to these packages refers to protecting this blocking junction from contamination.

In the illustrated embodiment, the device 12 includes a light responsive device such as a light triggered thyristor having a light sensitive or light responsive terminal 13 such as a light triggered thyristor 12. As before, the cover 30 includes means coupling a signal between the device terminal 13 and the appropriate external device. In this embodiment, the cover has been etched or drilled to provide opening 50 to allow light to impinge upon the light responsive terminal 13 or light receiving area of the light triggered thyristor 12. As shown in FIG. 3, light can be supplied to the packaged device 12 by a light pipe or quartz rod 54 which can be fixedly secured or bonded, for instance, by an epoxy (not shown) to the upper exterior surface 29 of the cover 30. The light pipe 54 can be suitably positioned and adjusted to cause light to impinge upon the light responsive area of the device 12. In an alternate embodiment not shown, the light triggered device 12 can be replaced with a light emitting device such as a light emitting diode with the light pipe 54 providing the required coupling of the internally generated signal to the external environment.

Figure 4:
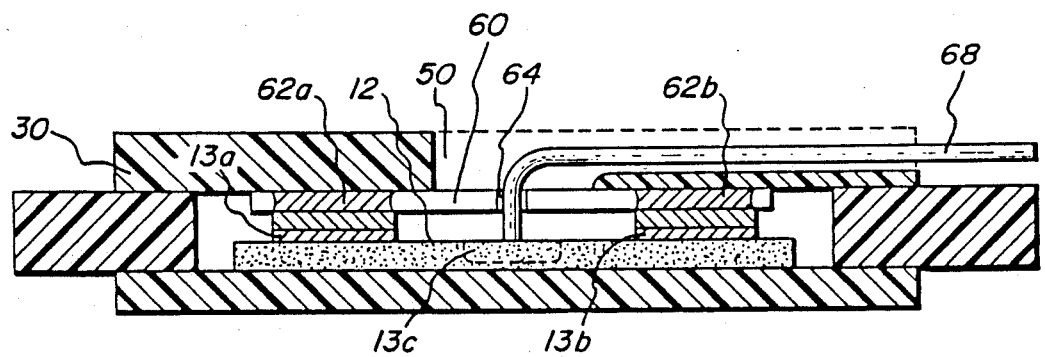
FIG. 4 is a cross-sectional view of a still further alternate preferred embodiment of the semiconductor package of the invention enclosing a light responsive chip based device.

FIG. 4 illustrates an alternate preferred embodiment of the all-semiconductor hermetic package 10 of the present invention as used with a light triggered device 12. The light triggered device 12 is disposed on the base wafer 15 and is surrounded by the sidewall spacer washer 20. The thickness of the spacer washer 20 in this embodiment, however, is greater than the total thickness of the chip 12 and contact washer 25 to accommodate a special substantially planar semiconductor plate 60 disposed over the upper surface of the semiconductor chip 12. The plate 60 includes a means for coupling external signals between an external signal source or drain, through the device package to the appropriate device terminal 13. The illustrated embodiment can, for instance, have conventional metallized source and drain electrodes 13a and 13b, but a light controlled or triggered gate terminal 13c. External signals can be coupled to the conventional electrodes 13a and 13b by the above-discussed conductive region technique wherein first and second selected regions 62a and 62b of the plate 60 in registry with the first and second electrodes 13a and 13b can be rendered conductive by, for instance, increasing the impurity concentration of the region by preforming a thermal gradient zone melting of the region or alternatively establishing a conductive via therethrough.

In a similar manner, the portion or region of the plate 60 in registry with the light triggered terminal 13c can be appropriately conditioned to couple an electromagnetic signal to an appropriate electrode. In this instance, the applied trigger signal is light signal and the region 13c must therefore be rendered light conductive. As in FIG. 3, a light conductive window 50 is opened through the cover 30 and a second window 64 is opened through the plate 60 to allow externally generated light to impinge upon the device terminal 13c. In a still further embodiment, a light pipe 68, such as a fiber optic medium, can be inserted through the window 64 in the plate 60 to facilitate the conduction and transmission of light through the package 10 with low losses. The light pipe 68 is fixedly positioned and hermetically sealed within the cover 30 and plate 60 to contribute to hermeticity of the package 10. The light pipe 68, for instance, can be attached to the package 10 with epoxy or RTV sealant and sealed within the package 10 with a boron glass (not shown) having a coefficient of thermal expansion which closely approximates or matches the coefficient of thermal expansion of the package 10.

The semiconductor cover 30 is disposed over the spacer washer 20 and the plate 60 to hermetically seal the plate 60 and chip 12 within the semiconductor package 10. As illustrated in FIG. 4, a portion of the cover 30 may be etched away to facilitate the insertion and permanent positioning of the light pipe 68.

Although the packages shown in FIGS. 3 and 4 have an opening therethrough to permit access to, for instance, a light controlled electrode, the package remains hermetic in the region of the blocking junction of the device. The blocking junction is the junction which during reverse bias condition, supports the reverse bias potential of the device. The hermetic seal about the blocking junction, avoids contamination of the junction by impurities which can impair the integrity or partially short the blocking junction. If this junction is impaired, the device 12 may not operate according to specification, and can be subject to premature failure possibly leading to serious damage of this device and associated devices.

Figure 5:
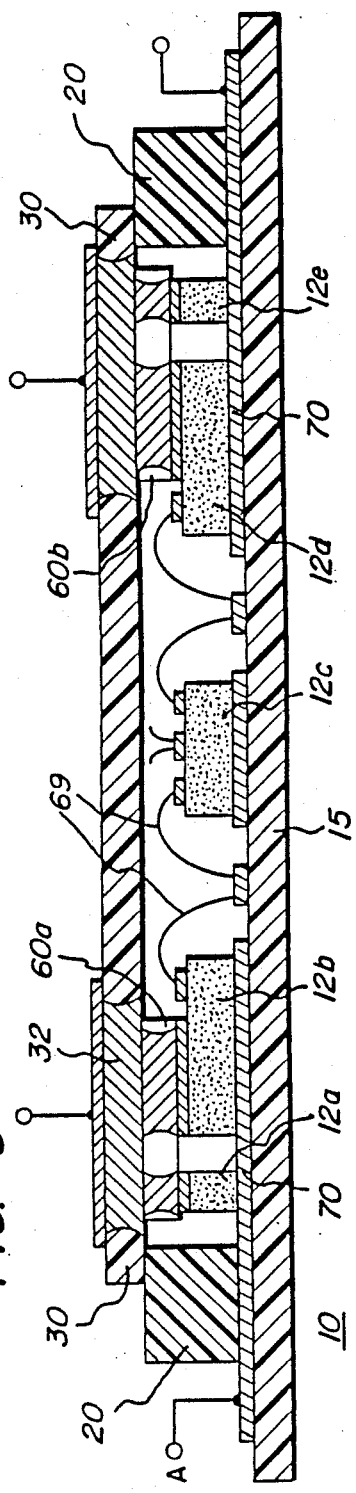
FIG. 5 is a cross-sectional view of an alternate preferred embodiment of the semiconductor package of the invention employing a patterned base.

FIG. 5 is a cross-sectional view of an alternate preferred embodiment of the semiconductor hermetic package 10 of the present invention in an expanded format. Several devices 12 are disposed within a single semiconductor package and can be interconnected by metallized paths or tracks 70 disposed in appropriate interconnect patterns on the base plate 15. As illustrated in FIG. 5, the package 10 includes a base member 15, devices 12a, 12b, 12c, 12d, 12e, plates 60a and 60b, a sidewall spacer washer 20, and a cover 30. The semiconductor chip 12 of the prior examples disposed within the all semiconductor packages of the present invention is, in this example, replaced by five separate devices: diodes 12a and 12e appearing on the far right and far left, field effect transistors or FETs 12b and 12d appearing adjacent the diodes 12a and 12b, and centrally disposed integrated circuit 12c. These devices can be interconnected by means of the metallization layer 70 disposed on the base wafer 15. In this embodiment, the base 15 has been patterned with a conductive means such as a metallization layer 70 which has been configured in a desired pattern for interconnecting devices 12a-12e disposed thereon in a desired relationship. As illustrated, the metallization layer 70 interconnects the anode of diode 12a and the drain of FET 12b with each other and an external source A of electrical energy. The base metallization layer 70 can extend hermetically between the sidewall 20 and the base 15 to an external surface of the package 10 to thereby provide an external contact to the internal device by extending the metallization layer 70 through the semiconductor package 10. The semiconductor packaging system can also employ wire bond interconnections 69 shown, for instance, interconnecting the gate of the FET to a contact pad and the IC to a contact pad. The upper contact surfaces of the diode, FET and IC respectively include metallization layers or metallized electrodes for making appropriate external contacts. As illustrated, for instance, in the far left of FIG. 5, a partially conductive plate 60a previously discussed in relation to FIG. 4 can be used to interconnect the cathode of diode 12a and the source of FET 12b to, for instance, a cathode terminal of the package 10 through the cover 30 by a conductive region 32 which is in registry with the conductive regions of the plate 60.

Figure 6:
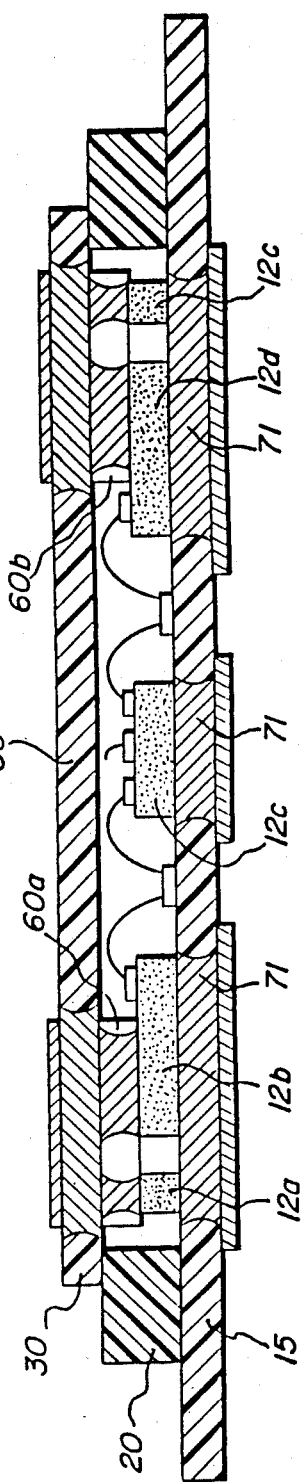
FIG. 6 is a cross-sectional view of an alternate preferred embodiment of the present invention in which a plurality of chip based devices are interconnected by and within a single package.

FIG. 6 is an alternate preferred embodiment of the present invention and illustrates the semiconductor hermetic package 10 of the present invention wherein one or more selected and appropriately configured regions 71 of the semiconductor base 15 of the package 10 have also been rendered conductive by, for instance, the above-discussed techniques whereby signals can be coupled through the base 15 to and from the appropriate electrode 13 shown of the enclosed device 12 as shown.

Figure 7:
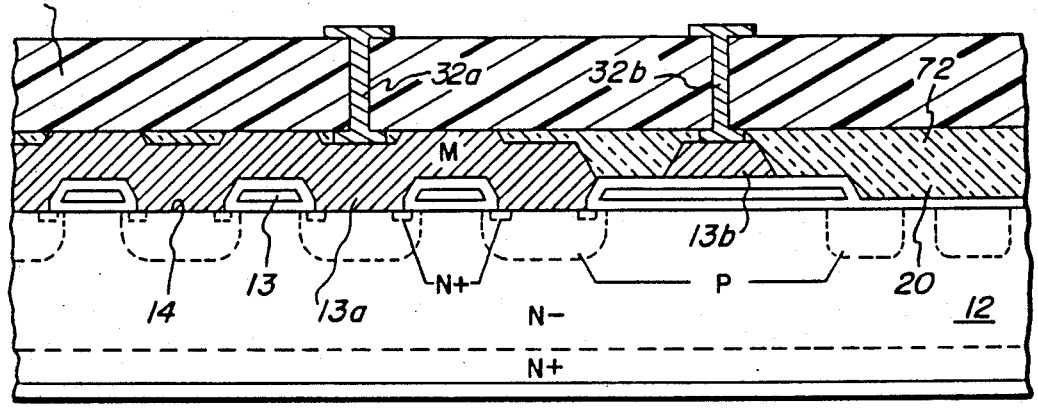
FIG. 7 is a cross-sectional view of a still further preferred embodiment of the present invention in which the semiconductor chip itself forms the base of the semiconductor package.

FIG. 7 is a still further alternate preferred embodiment of the semiconductor hermetic package 10 of the present invention in which similar parts have had like reference numbers carried forward. In particular, in this embodiment, the base 15, shown in FIG. 3, has been eliminated and instead, the chip itself or substrate of the device 12 has been used as the base of the package 10 and the sidewall spacer 20 has been formed in situ by a glass preform or by depositing a sealing glass layer on and over the upper surface 14 of the device 12.

Contact to the device terminals 13 is made by depositing a metal layer M over and on the upper surface 14 of the device 12 and then the excess metal or metal covering areas of the device which should not be metallized is removed leaving the device terminals 13 metallized. The metal is typically aluminum and is typically applied in a thickness in the range of 0.5-1 mil, for example. A layer of glass 72 such as a glass preform available from Glass Seal Products, Lakewood, New Jersey, is then applied over the metallization. The preformed or deposited glass 72 can cover the upper surface 14 of the device 12 and envelope the sidewalls of the device metallization. If necessary, a window is then opened through the glass 72 to expose the terminal metallization 13a and 13b which are then coated with a solder metal and pretinned with, for instance, reflowable solder (see FIG. 9 below). External connection to the enclosed device is made through the cover 30. The conductive regions 32 corresponding to a respective device terminal 13, shown as conductive vias through the cover 30, can be pretinned on their inner surfaces with, for instance, reflowable solder (shown in FIG. 9) to make electrical and mechanical contact with the device terminal 13. The cover 30 is applied to the device and the assembly is heated typically to between 350° C.–400° C. and then cooled to vitrify the glass, hermetically sealing the glass 72 to the device surface 14 and also reflowing the solder to form solder connection between the conductive regions 32a and 32b and the metallized terminal 13a and 13b respectively, of the device 12.

Figure 8:
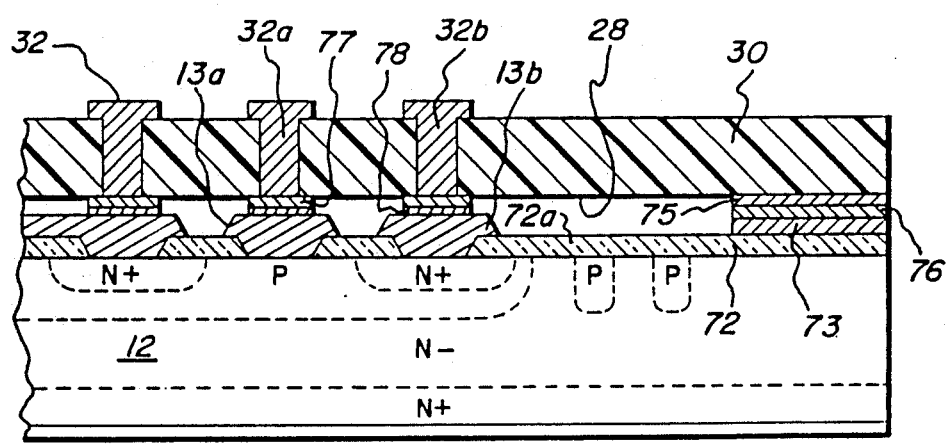
FIG. 8 is a cross-sectional view of a still further preferred embodiment of the invention in which the cover is secured to the base by a combination of metal and oxide layers.
Figure 9:
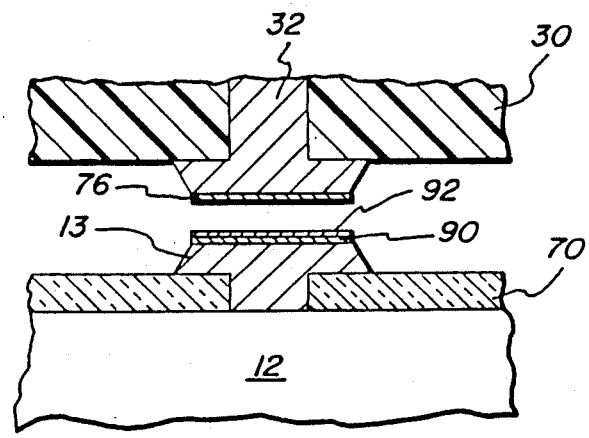
FIG. 9 is an illustration of an interconnection between the cover member of the package of the invention and a device terminal of the enclosed device.

FIG. 8 is an alternate embodiment of the present invention in which the cover 30 is sealed to the device 12 by a combination of glass 72 and solderable metal layers 73 and 75. The terminals 13 of the device 12 can be metallized with a solderable metal 78 and pretinned with a reflowable solder (not shown) to form a solder metal contact. The solder metal contact 78 makes electrical and mechanical connection to the corresponding contact region 32 disposed in the cover shown as a conductive via having a metallized interior surface 77 which can be pretinned with reflowable solder (not shown). A preform glass or oxide 72 is also applied to the surface 14 of the device 12. The exposed surface 72a of the glass or oxide 72 is then covered with a solderable metal 73 and pretinned with reflowable solder 76. Similarly, the lower surface 28 of the cover 30 is also provided with a solderable metal layer 75 and can also be pretinned with reflowable solder 76. The cover 30 is applied to the device 12 and is typically heated to approximately 350°–400° C., for example, and then cooled. A solder bond is formed between the cover 30 and the device 12 and the cover 30 is thereby hermetically sealed to upper component surface of the device 12. Similarly, inner surface of the conductive regions 32a and 32b of the cover 30 are solder bonded in an electrically conductive relationship with the upper surface terminal 13a and 13b of the device 12.

The term solderable metal has been used above. As known, not all metals or materials are clearly solderable. It is sometimes necessary to apply a layer of solderable metal to a non solderable metal. In the example illustrated in FIG. 9 a device terminal 13 metallized with aluminum is coated with first a layer of chromium 90 and then a second layer 92 of copper. Although copper does not adhere directly to aluminum, the chromium layer adheres to both copper and aluminum and is used to interface the copper to the aluminum. Thus, the device terminal 13 has been coated with a solderable metal similar to the cover terminal 32, which in this example is also made of solderable metal such as copper. Either or both the device terminal 13 and cover region 32 can be pretinned with a reflowable solder 76 to upon appropriate heating allow the device terminal 13 and cover region 32 to be structurally bonded together and electrically connected. A solderable chip metallization system can be used advantageously to form low resistance connections between the conductive regions 32 penetrating the cover 30 and the metallized terminals 13a and 13b of the device 12.

It is to be understood that while the semiconductor hermetic package 10 has been described in a preferred embodiment, the invention is not so limited. Variations of the disclosed packaging system will be readily apparent to those skilled in the art. More particularly, various electrode regions can be brought out above and below or through the sidewall 20, the cover 30 and base 15 can be provides with various contact patterns and metallization layers as needed. A plurality of spacers 25 and other separation members can be disposed internal to the package to provide electrical contact as well as adequate separation and rigidity to the package as a whole. While the package system has been disclosed as comprising a base 15, sidewall 20, and cover 30, an alternate embodiment as shown in FIG. 7 can comprise a semiconductor base or cover wherein the sidewall has been formed integral with the base or cover to provide a two member package. This is particularly advantageous where the device design is such that the terminations of all high voltage junctions lie under the cap and do not extend through the device edge. In this embodiment, a thicker semiconductor substrate can be used and a device receiving cavity can, for instance, be etched in the substrate.

While the preferred embodiment of the present invention has been illustrated and described, it is clear that the present invention is not so limited. Numerous modifications and changes, variations, substitutions, and equivalents will occur to those skilled in the art without departing from the true spirit and scope of the present invention. Accordingly, it is intended that the invention herein be limited only by the scope of the appended claims.

What is claimed is:

1. A packaged semiconductor device comprising:
   a semiconductor device having a signal terminal;
   a substantially planar base comprising the same semiconductor material as said device and having a thermal expansion coefficient which closely matches that of said device, said base having a first upper surface;
   a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
   said sidewall spacer in combination with said base defining a cavity containing said semiconductor device;
   a cover having a first lower surface sealingly engaging said second upper surface of said sidewall spacer to enclose said device in said cavity, said cover comprising the same semiconductor material as said device and having a thermal expansion coefficient which closely matches that of said device; and
   one of said base, sidewall spacer and cover including means for coupling a signal between an external signal source and said signal terminal of said enclosed semiconductor device, said means for coupling including a selected portion of one of said base, sidewall spacer, and cover, said selected portion being in registry with a terminal of said semiconductor device and being specially treated to be conductive to signals applied thereto.

2. The packaged semiconductor device of claim 1 wherein said selected portion is electrically conductive and directly contacts said terminal.

3. The packaged semiconductor device of claim 1 wherein said selected portion is light conductive.

4. The packaged semiconductor device of claim 1 wherein said selected portion is electrically conductive.

5. The packaged semiconductor device of claim 4 wherein said selected portion is doped to degeneracy.

6. The packaged semiconductor device of claim 4 wherein said selected portion exhibits an impurity concentration in excess of $10^{20}$ dopant atoms per cubic centimeter.

7. A packaged semiconductor device comprising:
   a semiconductor device having a signal terminal;
   a substantially planar base comprising the same semiconductor material as said device and having a thermal expansion coefficient which closely matches that of said device, said base having a first upper surface;
   a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
   said sidewall spacer in combination with said base defining a cavity containing said semiconductor device;
   a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device, said means for coupling including a conductive via established through at least one of said base, sidewall, and cover in a region thereof in registry with a selected terminal of said device.

8. A packaged semiconductor device comprising:
a semiconductor device having a signal terminal;
a substantially planar base comprising the same semiconductor material as said device and having a thermal expansion coefficient which closely matches that of said device, said base having a first upper surface;
a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device, said sidewall being annular in configuration and comprising high resistivity semiconductor material;
said sidewall spacer in combination with said base defining a cavity containing said semiconductor device;
a cover having a first lower surface sealingly engaging said second upper surface of said sidewall spacer to enclose said device in said cavity, said cover comprising the same semiconductor material as said device and having a thermal expansion coefficient which closely matches that of said device; and
one of said base, sidewall spacer and cover including means for coupling a signal between an external signal source and said signal terminal of said enclosed semiconductor device.

9. The packaged semiconductor device of claim 7 wherein said electrically conductive portion of said one of said base, sidewall spacer, and cover exhibits a configuration similar to the configuration exhibited by said signal terminal of said device.

10. A packaged semiconductor device comprising:
a semiconductor device having a signal terminal, said semiconductor device including a blocking junction and said signal terminal being a light responsive terminal;
a substantially planar base comprising the same semiconductor material as said device and having a thermal expansion coefficient which closely matches that of said device, said base having a first upper surface;
a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
said sidewall spacer in combination with said base defining a cavity containing said semiconductor device;

a cover having a first lower surface sealingly engaging said second upper surface of said sidewall spacer to hermetically enclose said blocking junction of said device in said cavity, said cover comprising the same semiconductor material as said device and having a thermal expansion coefficient which closely matches that of said device; and
one of said base, sidewall spacer and cover including means for coupling a signal between an external signal source and said signal terminal of said enclosed semiconductor device, said means for coupling being suitable for transmitting light signals through at least one of said base, sidewall, and cover to said light responsive terminal of said device.

11. The packaged semiconductor device of claim 10 wherein said means for coupling is hermetically sealed through at least one of said base, sidewall spacer and cover.

12. The packaged semiconductor device of claim 10 wherein said means for coupling transmits light signals to said device and includes a quarts rod.

13. The packaged semiconductor device of claim 10 wherein said coupling means penetrates said semiconductor package in a region non-adjacent to a blocking junction of said device and said blocking junction is enclosed within said package.

14. The packaged semiconductor device of claim 13 wherein said package includes a metallization pattern disposed within said package and said metallization pattern includes at least one conductive track.

15. The packaged semiconductor device of claim 14 wherein said conductive track extends to the exterior surface of said package.

16. A packaged semiconductor device comprising:
a semiconductor device having a signal terminal;
a substantially planar base comprising the same semiconductor material as said device and having a thermal expansion coefficient which closely matches that of said device, said base having a first upper surface;
a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
said sidewall spacer in combination with said base defining a cavity containing said semiconductor device;
a cover having a first lower surface sealingly engaging said second upper surface of said sidewall spacer to enclose said device in said cavity, said cover comprising the same semiconductor material as said device and having a thermal expansion coefficient which closely matches that of said device;
said sidewall spacer being coupled across two terminals of said device to provide a grading resistance therefor; and
one of said base, sidewall spacer and cover including means for coupling a signal between an external signal source and said signal terminal of said enclosed semiconductor device.

17. A packaged semiconductor device comprising:
a semiconductor device having a signal terminal;
a substantially planar base comprising the same semiconductor material as said device and having a thermal expansion coefficient which closely matches that of said device, said base having a first upper surface;

a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;

said sidewall spacer in combination with said base defining a cavity containing said semiconductor device;

a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device;

said base comprising a semiconductor wafer;

said semiconductor device being fabricated in said base wafer; and said sidewall spacer comprising a layer of glass comprising said semiconductor material disposed on said base wafer.

18. A packaged semiconductor device comprising:
a semiconductor device having a signal terminal;
a substantially planar base comprising the same semiconductor material as said device and having a thermal expansion coefficient which closely matches that of said device, said base having a first upper surface;

a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;

said sidewall spacer in combination with said base defining a cavity containing said semiconductor device;

a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device, at least one of said base, sidewall spacer, and cover comprising high resistivity polysilicon.

19. A packaged semiconductor device comprising:
a semiconductor device having a signal terminal;
a substantially planar base comprising the same semiconductor material as said device and having a thermal expansion coefficient which closely matches that of said device, said base having a first upper surface;

a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;

said sidewall spacer in combination with said base defining a cavity containing said semiconductor device;

a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device, at least one of said base, sidewall spacer, and cover comprising oxygen doped polysilicon.

20. A packaged semiconductor device comprising:
a semiconductor device having a signal terminal;
a substantially planar base comprising the same semiconductor material as said device and having a thermal expansion coefficient which closely matches that of said device, said base having a first upper surface;

a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;

said sidewall spacer in combination with said base defining a cavity containing said semiconductor device;

a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device, said cover and base being electrically conductive, said sidewall spacer being resistive and said means for coupling being disposed in one of said cover or base.

21. A packaged semiconductor device comprising:
a semiconductor device having a signal terminal;
a substantially planar base comprising the same semiconductor material as said device and having a thermal expansion coefficient which closely matches that of said device, said base having a first upper surface;

a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;

said sidewall spacer in combination with said base defining a cavity containing said semiconductor device;

a cover having a first lower surface sealingly engaging said second upper surface of said sidewall spacer to enclose said device in said cavity, said cover comprising the same semiconductor material as said device and having a thermal expansion coefficient which closely matches that of said device; and one of said base, sidewall spacer and cover including means for coupling a signal between an external signal source and said signal terminal of said enclosed semiconductor device, said sidewall spacer comprising a layer of glass comprising said semiconductor material and vitrified to said first surface of said base and said first surface of said cover.

22. A packaged semiconductor device comprising:
a semiconductor device having a signal terminal;
a substantially planar base comprising the same semiconductor material as said device and having a thermal expansion coefficient which closely matches that of said device, said base having a first upper surface;
a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
said sidewall spacer in combination with said base defining a cavity containing said semiconductor device;
a cover having a first lower surface sealingly engaging said second upper surface of said sidewall spacer to enclose said device in said cavity, said cover comprising the same semiconductor material as said device and having a thermal expansion coefficient which closely matches that of said device; and
one of said base, sidewall spacer and cover including means for coupling a signal between an external signal source and said signal terminal of said enclosed semiconductor device; and
said sidewall spacer comprising a layer of glass comprising said semiconductor material applied to said first surface of said base, a first layer of reflowable solder applied over said glass layer, and a second layer of reflowable solder applied over said first lower surface of said cover, said glass and reflowable solder having been heated to form a solder bond between said sidewall spacer and said cover.

23. The packaged semiconductor device of claim 22 wherein said layers of glass and reflowable solder are disposed on the peripheral edge of the device, and hermetically seal said cover to said device.

24. A packaged semiconductor device comprising:
a semiconductor device having a signal terminal;
a substantially planar base comprising the same semiconductor material as said device and having a thermal expansion coefficient which closely matches that of said device, said base having a first upper surface;
a sidewall spacer having a first lower surface and a second upper surface, said first lower surface sealingly engaging said first upper surface of said base, said sidewall spacer comprising the same semiconductor material as said device and having a thermal expansion coefficient which closely matches that of said device;
said sidewall spacer in combination with said base defining a cavity containing said semiconductor device;
a cover having a first lower surface sealingly engaging said second upper surface of said sidewall spacer to enclose said device in said cavity, said cover comprising the same semiconductor material as said device and having a thermal expansion coefficient which closely matches that of said device; and
one of said base, sidewall spacer and cover including means for coupling a signal between an external signal source and said signal terminal of said enclosed semiconductor device, said means for coupling a signal including a conductive region having an inner conductive surface associated with a corresponding device terminal, said device terminal being solder bonded to said conductive inner surface of said conductive region in a low resistance electrically conductive connection.

* * * * *